United States Patent [19]

Delaporte et al.

[11] 4,340,922

[45] Jul. 20, 1982

[54] INTERFACE CIRCUIT IN CONFORMITY WITH EIA STANDARDS AND IMPLEMENTED WITH AN OPERATIONAL AMPLIFIER-LIKE CIRCUIT

[75] Inventors: Francois X. Delaporte, Cros de Cagnes; Gerard M. Lebesnerais, Perthes; Jean-Pierre Pantani, Nice, all of France

[73] Assignee: International Business Machines Corp., Armonk, N.Y.

[21] Appl. No.: 208,959

[22] Filed: Nov. 21, 1980

[30] Foreign Application Priority Data

Nov. 28, 1979 [FR] France .................................. 79 29808

[51] Int. Cl.$^3$ ............................................. H02H 9/04
[52] U.S. Cl. ...................................... 361/91; 361/56; 361/100
[58] Field of Search .................... 361/56, 111, 91, 100; 307/475, 540, 544, 561, 565; 330/298, 207 P

[56] References Cited

U.S. PATENT DOCUMENTS

| | | | |
|---|---|---|---|
| 3,757,138 | 9/1973 | Bhatia et al. .................. | 307/235 R |
| 4,158,863 | 6/1979 | Naylor .................................. | 361/56 |
| 4,178,619 | 12/1979 | Seiler et al. ........................... | 361/91 |

FOREIGN PATENT DOCUMENTS 2307540 8/1974 Fed. Rep. of Germany .
2515655 10/1976 Fed. Rep. of Germany .
2146091 7/1971 France .
2363215 7/1977 France .

OTHER PUBLICATIONS

A. S. Myers, Jr., "EIA Level Cable Driver", IBM Technical Disclosure Bulletin, vol. 20, No. 1, Jun. 1977, pp. 319-320.
R. C. Dobkin, "IC With Load Protection Simulates Power Transistor", *Electronics*, Feb. 7, 1974, pp. 119-123.
*The Integrated Circuits Catalog for Design Engineers*, First Edition, Texas Instruments, Inc., pp. 3-149 through 3-152.
F. Delaporte et al., "Antisaturation Circuit for an Operational Amplifier", IBM Technical Disclosure Bulletin, vol. 22, No. 2, Jul. 1979, pp. 610-611.
F. Delaporte et al., "Logic Interface Module", IBM Technical Disclosure Bulletin, vol. 21, No. 11, Apr. 1979, pp. 4559-4560.

*Primary Examiner*—Reinhard J. Eisenzopf
*Attorney, Agent, or Firm*—John A. Jordan

[57] ABSTRACT

An interface circuit for exchanging digital signals between two pieces of data processing equipment is provided in integrated form in accordance with international standards, such as EIA Standards. This is achieved through modification of an operational amplifier to adapt its use to the conditions and requirements of interface circuits.

12 Claims, 5 Drawing Figures

INTERFACE CIRCUIT IN CONFORMITY WITH EIA STANDARDS AND IMPLEMENTED WITH AN OPERATIONAL AMPLIFIER-LIKE CIRCUIT

BACKGROUND OF THE INVENTION

1. Field of the Invention

The present invention relates to interface circuits, i.e., those circuits through which exchange of digital signals between data processing equipment is achieved. More particularly, the present invention relates to interface circuits in accordance with international standards, such as the Electrical Industry Association (EIA) RS 232C or the Comite Consullatif International des Telecommunications (CCITT) V 24 standards.

2. Description of the Problem and Prior Art

Owing to the existence of design standards, such as the EIA or CCITT standards, equipment from different origins, i.e. manufacturers, may readily be interconnected. These interface circuits have, therefore, a capital function and are widely used to link different types of data processing equipment together, as for example, a terminal (or a multiplexer, or a processor) to a modem, or the like. The EIA standards define the interchange procedures and electrical characteristics of the signals (voltages, impedances, etc.).

In the EIA RS 232C and/or the CCITT V24 standards to which the present invention is concerned, the binary signals are quite different from those existing inside the machines and are unrelated to any of the known technologies, such as, TTL (Transistor-Transistor Logic), ECL (Emitter-Coupled-Logic), etc. The signal characteristics for these standards are defined in the following paragraphs.

The positive voltage level range of the interface circuit must lie between +5 and +15 volts. Likewise, the negative voltage level range must lie between −5 and −15 volts. The prohibited range is the −3 V to +3 V zone which, of course, includes 0 volts. Signals should not lie in this prohibited range at anytime. The impedance at the input of the circuit receivers must be resistive, with $3k\Omega \leq R \leq 7k\Omega$.

The interface circuit output voltage during transitions from high voltage state to low voltage state should vary at a well-defined rate within closely specified maximum and minimum levels in order to obtain signals with a sufficiently high rate while avoiding the well-known crosstalk phenomena caused by slew rates too steep. The slew-rate ($\Delta v/\Delta t$) of the output signal should be comparatively independent (within given limits) of the load applied to the output.

In addition, the interface circuit must withstand an accidental misconnection at any voltage within −15 volts to +15 volts and not be the cause of excessively high currents that might cause connecting cable or equipment destruction. This applies to the interface circuit being "powered on" as well as being "powered off". Means should be provided to prevent erratic signals from being transmitted to the output at the time the circuit is turned on. Additionally, a high impedance state is desirable for parallel applications (the so-called tristate mode). When the interface circuit is not powered, the circuit output should present an impedance equal to, at least, $300\Omega$.

A large variety of interface circuits are known in the prior art with a considerable number commercially available. Such prior art circuits are particular to an application, relatively simple and cheap but, unfortunately, have a number of significant drawbacks. For example, prior art interface circuits exhibit low density; very often there are only two interface circuits per module.

Typically, components external to the integrated interface circuits are necessary to fulfill auxiliary functions, e.g. to control the slew rate (capacitor), protect against possible overvoltages (diodes), remove erratic signals at the time the circuit is turned on, etc.

Likewise, these circuits typically require high supply voltages (e.g. $|V_{CC}| \geq 12$ volts) while the present tendency is to use lower supply voltages. As is understood, a lower voltage (8 volts, for instance) is of advantage in terms of electrical comsumption and thermal dissipation but is not compatible with the requirement of having voltage magnitudes greater than +5 volts and −5 volts. In addition, during interface circuit power on, it is necessary that power supplies be set according to a special sequence to avoid erratic signal problems. This is necessary because output currents are not high enough to drive several and/or long connecting cables.

A typical interface circuit (line driver) and its characteristics is described in the handbook entitled "The Integrated Circuits Catalog for Design Engineers", First Edition, Texas Instruments Inc., at pages 3-149 through 3-152. It should be noted that this circuit is not compatible with all the logic families as, for example, ECL logic. It is also noted that the slew rate control is accomplished by an external capacitor and, thus, the circuit requires adaptation for each particular case (line, customer, etc.). The Texas Instrument circuit also requires high supply voltages (±12 volts) and cannot be used in the "tristate" mode. Finally, this circuit demands a high supply current.

SUMMARY OF THE INVENTION

It is, therefore, an object of the present invention to provide an improved interface circuit conforming to the requirements of interface standards, as described above.

It is a further object of the present invention to provide an interface circuit which is an inexpensive, highly integrated, monolithic arrangement with no external components or adjustments, and which can be implemented in conventional bipolar technology with high product through-put.

It is still a further object of the present invention to provide an interface circuit that is readily compatible with any of the most common logic technologies (TTL, ECL, etc.), and which operates with comparatively low supply voltages $\pm V_{CC}$.

It is yet still a further object of the present invention to provide an interface circuit capable of supplying its output lines with a high current (10–20 mA), so as to allow for long capacitive cable arrangements.

The present invention, which will be disclosed in more detail hereinafter, is predicated on modifying and changing an operational amplifier to render it usable as an interface circuit, in accordance with the constraints discussed hereinabove.

Currently, operational amplifiers are primarily used in analog circuits application. Their adaptation to logic interface circuits, as proposed herein, presents a number of problems and difficulties. Overcoming these difficulties, however, results in an interface circuit exhibiting a number of important advantages over known interface circuits. Since operational amplifiers are well-known circuits of wide use in the electronic industry and highly developed and integrated and of low power consumption, it is advantageous to maintain their basic structural characteristics and yet make the necessary alterations to transform the amplifier into an interface circuit of high performance.

DETAILED DESCRIPTION OF THE DRAWINGS

Figure 1:
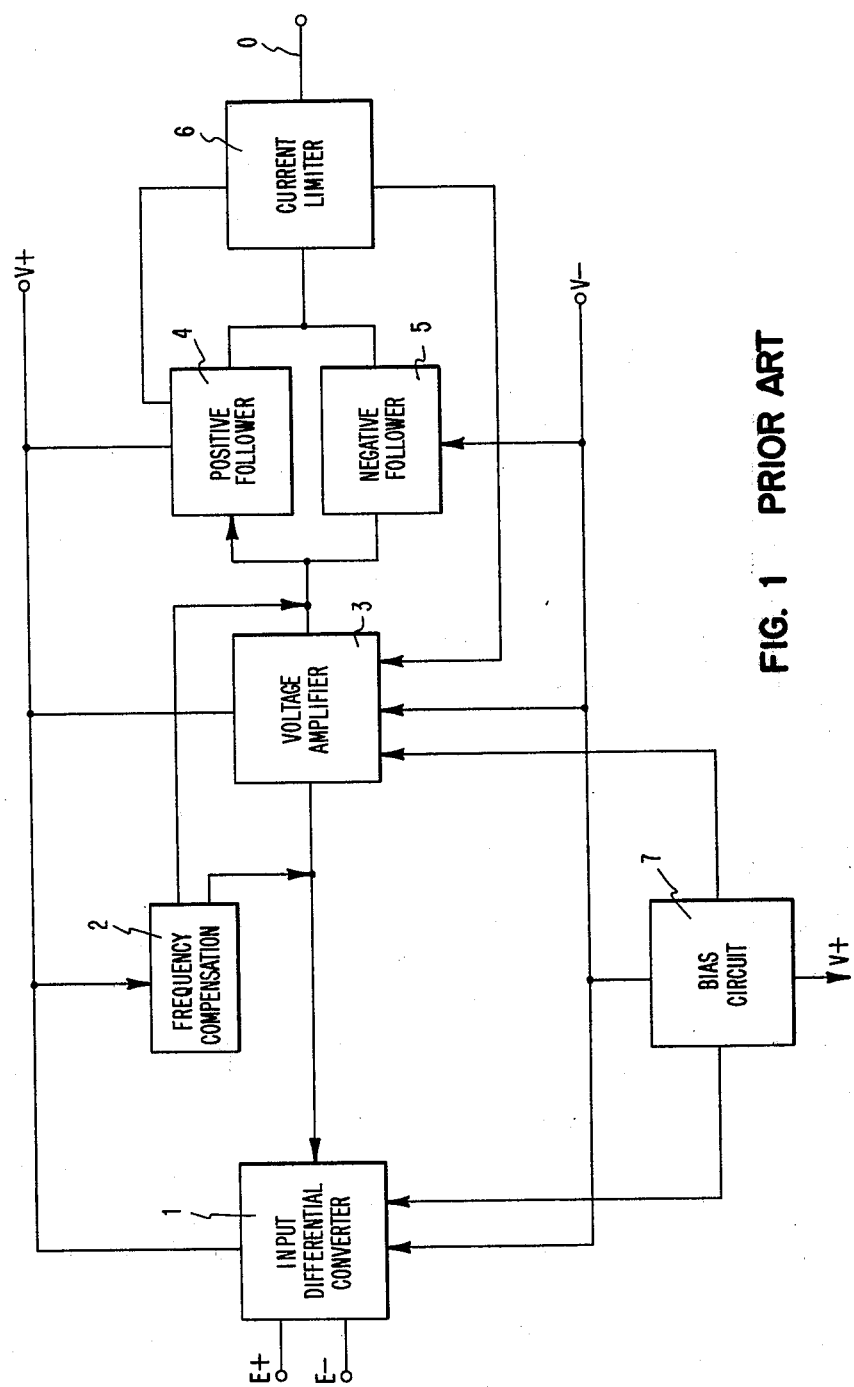
FIG. 1 shows a schematic block diagram of a conventional prior art operational amplifier illustrating the different subfunctions into which it may be broken down.
Figure 2:
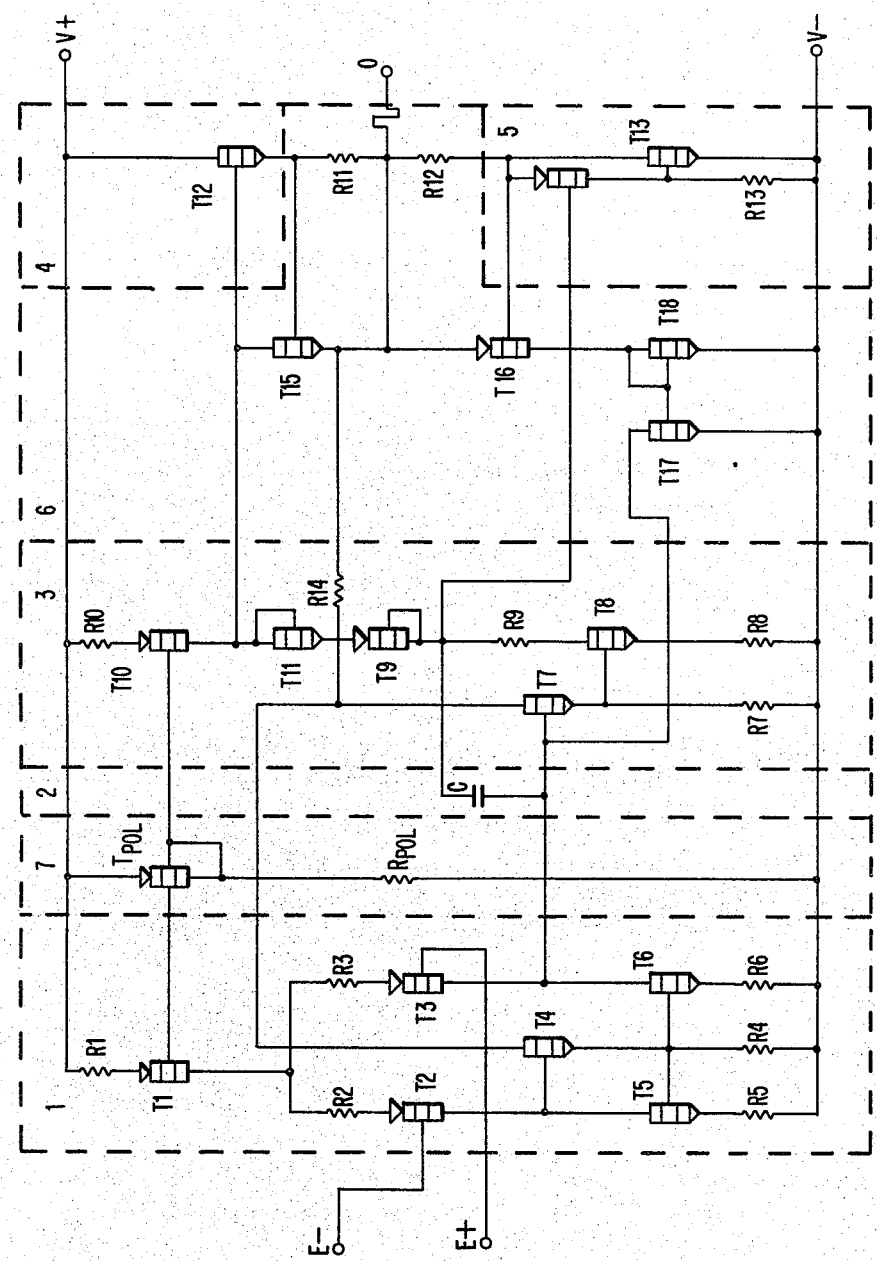
FIG. 2 shows an embodiment of the prior art operational amplifier of FIG. 1 in the form of an electrical circuit schematic such as could be implemented in a bipolar complementary PNP+NPN transistor technology.

In FIG. 1 there is depicted a block diagram representing a prior art operational amplifier with its basic functions while FIG. 2 shows such prior art operational amplifier implemented in the form of a complementary bipolar electrical circuit.

Operational amplifiers of the type shown in FIG. 1 include, in well-known manner, an input differential converter 1 provided with two inputs E— and E+ and an output which is coupled to the input of frequency compensation circuit 2. The outputs of frequency compensation circuit 2 are coupled to voltage amplifier 3. Two voltage follower circuits 4 and 5 (one positive and one negative) are coupled between voltage amplifier circuit 3 and current limiting circuit 6. The output signal from the operational amplifier appears at terminal 0. The system is powered by a symmetrical supply voltage having V+ and V— potentials. In addition, a biasing circuit 7 is used to bias differential converter 1 and voltage amplifier 3.

In the detailed implementation of the operational amplifier of FIG. 1 as more particularly shown in FIG. 2, the frequency compensation block comprises capacitor C. A similar operational amplifier is described by F. Delaporte et al. in the IBM Technical Disclosure Bulletin, Vol. 2, No. 2, July 1979, pages 610 and 611, in an article entitled "Anti-saturation Circuit for an Operational Amplifier". However, the operational amplifier of FIG. 2 differs from that shown by Delaporte et al. in that the input circuit including transistors T2-T4 and T3 and diodes D27 and D28 of Delaporte have been removed. In addition, transistors T8, T9 and T15 of the biasing circuit of Delaporte have been removed.

The use of such an operational amplifier has several advantages to its application to an interface circuit. For example, the existence of two differential inputs E— and E+ makes it possible to adapt its use in an interface circuit to any logic circuit type ahead of it, whatever its technology (e.g., ECL, TTL, FET, etc.). In addition, the amplifier circuit exhibits a low input current and a low output impedance. Moreover, a current limiter is provided which acts to avoid circuit destruction due to excess current caused by accidental disconnection of the output voltage to ground or to a positive or negative voltage.

Operational amplifiers are typically equipped with a frequency compensation circuit (as shown in FIG. 1), the purpose of which is to make the circuit stable when it is inserted into a closed loop (feedback) system. This compensation circuit has the secondary effect of limiting the slew rate of the output signal. What appears to be of definite disadvantage in normal use of operational amplifiers is of utmost advantage when such amplifiers are adapted to interface circuit application, in accordance with the present invention. Whereas manufacturers in the operational amplifier field make substantial efforts to minimize the effect of the compensation circuit on limiting slew rate, in accordance with the principles of the invention, electrical elements, such as voltages, resistances, capacities, are calculated in a precise way in order to make slew rate independent of load application.

Likewise, operational amplifiers are typically equipped with a biasing circuit (as shown in FIG. 1), the purpose of which is to set the output circuit into class AB operation in a precise manner. Though not its intended purpose in an operational amplifier, such biasing circuit will act to place the whole amplifier circuit in a high impedance state when the bias current is interrupted. In accordance with the present invention, then, the biasing circuit is modified from its initial purpose so that the biasing current may be controlled from an external circuit. With such modification, it is possible at either "power on" or in tristate operation to stop transmission of signals through the circuit, over the desired period of use.

However, in contrast to the above advantages, operational amplifiers of the type described typically exhibit significant drawbacks in that they cannot stand the overvoltages likely to occur on the transmission lines or during machine operation. In addition, such operational amplifiers exhibit too small an impedance when they are operated outside their power supply range, particularly in their "power off" condition.

A monolithic integrated interface circuit in conformity with EIA standards, in the form of a modified operational amplifier satisfying such standards, will be described hereinafter with reference to FIGS. 3 and 4.

PROTECTION AGAINST THE POSITIVE OVERVOLTAGES

Figure 3:
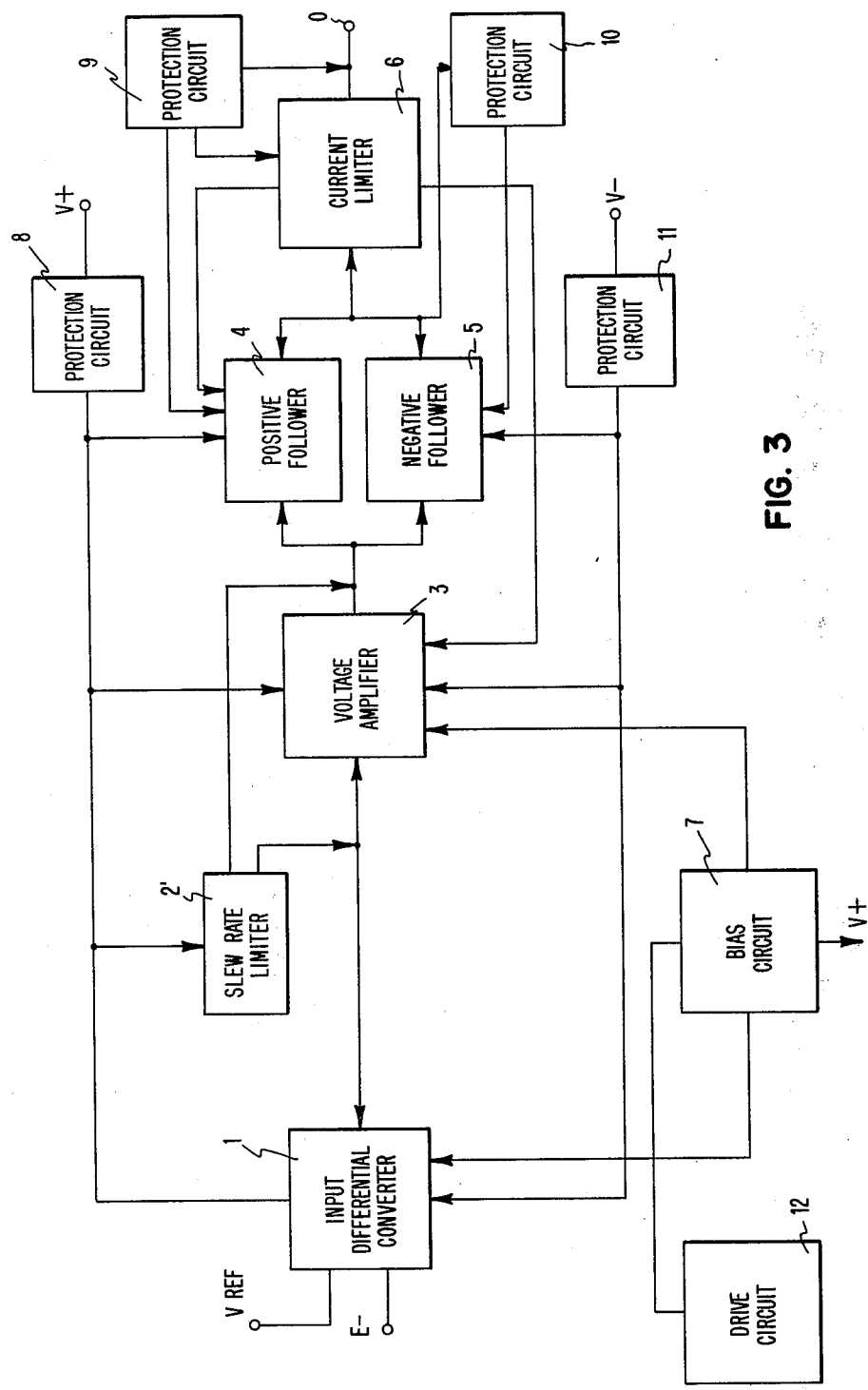
FIG. 3 shows a schematic diagram of the operational amplifier shown in FIG. 1 with modifications made therein in accordance with the present invention, such that the circuit operates as an interface circuit in accordance with interface standards, as described hereinabove.

With reference to FIG. 3, the purpose of block 8 is to protect the interface circuit against possible surges caused by voltages applied to output terminal 0 which would be more positive than supply voltage V+. This condition must be dealt with since the interface circuit is required to withstand +15 volt surges applied to terminal 0 while the supply voltage may be comparatively smaller, such as, for instance, V+ = +8 volts, or even 0 volts. The application of such an overvoltage to a conventional operational amplifier of the type as shown in FIG. 2 would result in directly biasing the base-collector junctions of transistors T12 and T15 (an inverted Darlington structure) thereby establishing a low impedance connection between the output and V+. The excessive currents which would be developed as a consequence, would cause destruction of the circuits.

Figure 4:
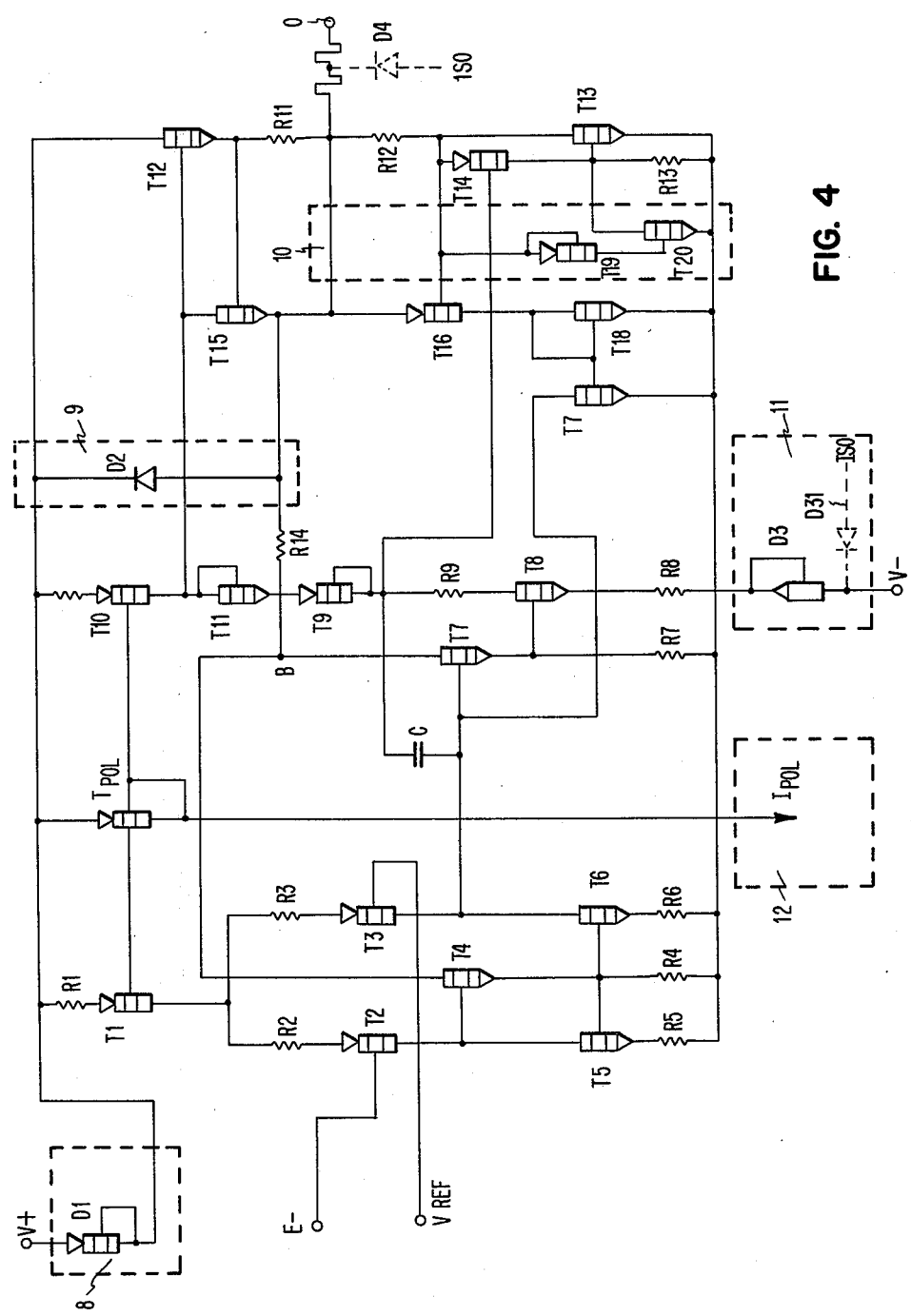
FIG. 4 shows an embodiment of the interface circuit of FIG. 3 such as could be implemented in a bipolar complementary NPN+PNP transistor technology.

In order to avoid such destruction, a blocking diode D1. as shown in FIG. 4, is series-mounted with voltage supply V+. Such a diode, however, presents some difficulties in its integration onto the same silicon chip as the remainder of the circuit. In particular, the emitter-base breakdown voltage of an NPN transistor with a short-circuited collector-base junction, which is the conventional arrangement for a diode used in a monolithic circuit, is too small (a few volts) for such application. In this regard, the collector-base breakdown voltage is higher but this junction causes leakage current to flow towards the substrate, which leakage current excessively increases thermal dissipation in the circuit.

A solution to the low NPN emitter-base breakdown voltage resides in making use of a diode-mounted PNP transistor where the emitter is the anode and the base and collector are short-circuited and form the cathode. Such a diode arrangement is characterized by a satisfactory breakdown voltage and low leakage current, in spite of a larger surface.

In spite of the use of blocking diode D1, however, application of positive overvoltages may produce additional detrimental effects. For example, although the overvoltage is no longer transmitted to V+ it does continue to feed the circuit itself and this takes place through the two above-mentioned inverted Darlington-mounted transistors T12 and T15. Such an inverted Darlington structure produces substantial current to the substrate and therefore causes an undesirable and non-negligible thermal dissipation. This problem may be resolved by placing diode D2 in FIG. 4 in bypass fashion to V+. This is shown as block 9 in FIG. 3. In a preferred arrangement, a bypass diode D2 is employed which starts conducting current at about 0.8 volts, a voltage which is not high enough for the inverted Darlington circuit to conduct. It should be noted that such a diode arrangement blocks the parasitical PNP transistors T12 and T15 together with isolation region (base, collector, isolation regions). In particular, D2 provides a shorted path to V+ for output current and prevents the inverted transistors from being forward biased, thereby avoiding current to the substrate. Such a diode can be readily implemented by connecting the epitaxial bed in which resistor R14 is diffused (or implanted), to line V+ of the circuit.

Finally, interface circuit application requires an arrangement for protecting transistors T13 and T14, in FIG. 4, in particular manner. In this regard, in PNP type transistors the breakdown voltages are lower than for NPN transistors and quite often do not meet requirements. Such defects are typically detected during chip tests, and lead to low manufacturing yield. It is, therefore, necessary that the breakdown voltage defects detected in the PNP-transistors do not result in defective circuit operation. The output PNP transistor T14 in FIG. 4 is particularly critical since any leakage current from this device would be fed to the base of auxiliary output NPN transistor T13 and would therefore be multiplied by the beta gain (100 to 200) of latter.

The solution to this latter problem comprises employing protection means for protecting the output stage and, more particularly, in mounting a second PNP transistor T19 in parallel with transistor T14 wherein transistor T19 acts as a leakage current indicator. The leakage current of transistor T19 is injected either into a current mirror or directly into the base of NPN transistor T20 which is used as a mirror amplifier device. To exhibit a leakage current equal to that of T14, T19 is connected such that its emitter to collector voltage is almost the same as that of T14. One particular arrangement is shown in FIG. 4, although several other arrangements are possible.

In the arrangement shown in FIG. 4, it can be seen that transistor T20 acts to draw possible leakage current coming from transistor T14 to V− thereby prohibiting it from being injected into the base of output NPN transistor T13. In this regard, transistors T19 and T20 together constitute an antibreakdown mirror circuit.

PROTECTION AGAINST THE NEGATIVE OVERVOLTAGES

In addition to the above protection arrangements, the interface circuit should also be protected against a condition wherein the output terminal is brought to a potential more negative than that of the negative supply V−, as, for example, when the output terminal goes to −15 volts and V−=−8 V. The circuit should be further protected for a condition wherein the output terminal goes negative and V−=0 V (unpowered circuits). Such conditions act to forward bias the base-collector junction and reverse bias the base-emitter junction of transistor T13. However, it is well-known that there is a junction breakdown at comparatively low voltages and this creates a strong current which may cause the transistor to be destroyed and thus prevent the module from satisfying the required operation. The arrangement shown in block 11 of FIG. 4 has been selected to protect the interface circuit. As can be seen, this arrangement employs blocking diode D3 which acts to prevent any reverse current from reaching the low impedance negative supply node.

However, integration of diode D3 into the circuit is another matter. The emitter-base junction of an NPN transistor exhibits a small breakdown voltage. On the other hand, the collector-base junction exhibits a higher breakdown voltage but generates a sizeable current to the substrate. Thus, using latter approach requires additional means to reduce the leakage current and, in fact, such means are arranged so that the disadvantages of using the collector-base junction are, as will be explained hereinafter, utilized to advantage.

It should also be noted that the occurrence of a negative overvoltage at the output terminal causes problems other than those described above. Conventional bipolar monolithic circuits (more specifically, operational amplifiers) will not generally withstand at their output terminal a voltage lower than the negative supply voltage (V−), and this is true irrespective of the breakdown of the output transistors. The reason is that in planar monolithic technology, component isolation is ensured by reversely biased junctions which are obtained by connecting the P substrate and P+ type isolation regions to the lowest negative supply (V−). Such isolation disappears when an output terminal and, therefore, necessarily, one of the epitaxial pockets, is brought to a more negative potential.

Figure 5:
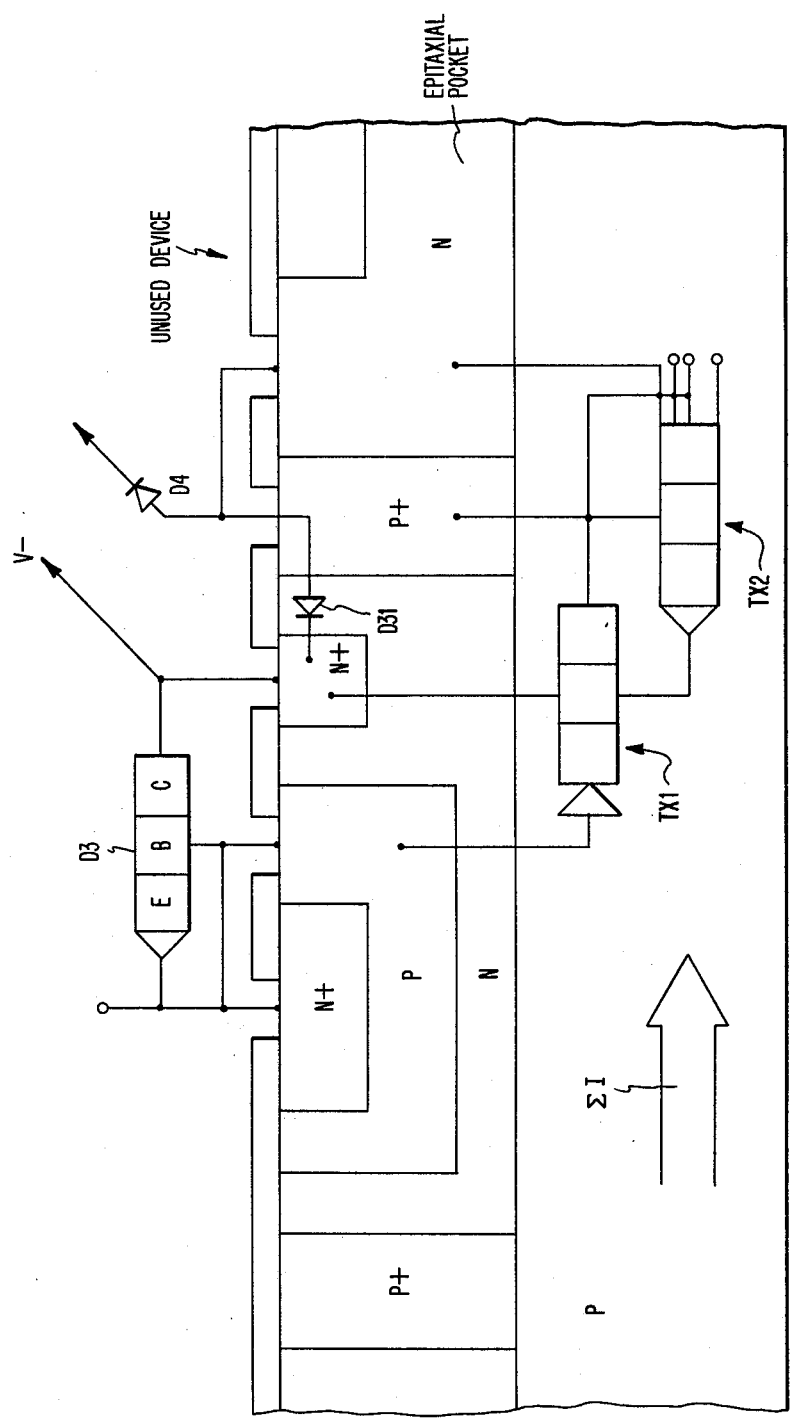
FIG. 5 shows in detail the protection arrangement (together with their associated parasitical devices) of the protection circuit structure 11 of FIG. 3.

In accordance with the principles of the present invention, a particular biasing arrangement is provided to avoid the isolation loss described above. Such a biasing arrangement comprises a circuit configuration arranged to bias the silicon substrate by means of an "injection" operation. FIG. 5 shows in detail the circuit configuration identified by block 11 in FIG. 4. According to this circuit arrangement in normal operation with outputs less negative than V−, positive carriers are injected into the substrate by means of transistor TX1 which is in reality a parasitic transistor associated with diode D3. These carriers, along with all other substrate current sources that may exist over the chip, will be collected by diode D31 and returned to voltage supply V−. Thus, the substrate will, itself, find its balance potential (slightly higher than V−) which potential will be more negative than any other node over the chip. Under these conditions, the sum of the currents injected into the substrate ($\Sigma I_{substrate}$) is equal to the current which can flow through the diode D31 when connected to voltage V−.

As shown in FIG. 4, where negative overvoltage occurs at the output 0, isolation no longer remains at a potential near to $-V_{CC}$ because of the action of diode D4. Under these conditions, diode D4 will pull the substrate potential to something close to output potential. In this regard, D4 will act like D3 under normal operation and both are returned to the conditions of the preceding case, i.e., the isolation is almost at the most negative potential, which is the desired condition.

Finally, a problem to be resolved resides in the effect of the many collectors associated to TX2. Since the isolation region comprises the base of TX2, any epitaxial pocket in the vicinity of TX2 emitter performs as another collector for TX2. Since some of these pockets are the collectors of active transistors TX2 they could affect operation of the rest of the circuit.

One solution to the effect of the multiple collectors of TX2 is to connect the emitter of the NPN transistor which forms diode D3 to its base. The emitter then acts as a collector and prevents the transistor from being saturated. The direct consequence of such an arrangement is that the number of carriers injected into the substrate is considerably reduced. Such an arrangement is laid out at the periphery of the chip next to a corner, as shown in FIG. 5, and is surrounded with screen epitaxial pockets which are not utilized for the active device and which are electrically connected to the isolation region. The pockets effectively act as additional collector circuits.

To summarize, lateral NPN transistor TX2 is constituted so that its emitter is the collector of the transistor which embodies diode D3. In addition, the base of transistor TX2 is the isolation region ISO, and the collectors (multiple in number) are the epitaxial pockets such as those shown in FIG. 5 surrounding the device. Since the base and the collector of transistor TX2 are tied together, the transistor does not saturate and this minimizes the carriers injected to the substrate thus preventing them from being conveyed to the active circuit.

BIASING OF THE CIRCUIT

Conventional operational amplifiers, such as shown in FIGS. 1 and 2, are biased by the current produced by resistor $R_{pol}$ which is series-mounted with transistor $T_{pol}$ between V+ and V−. With such an arrangement, an overvoltage applied at V+ through the output results in an undesirable increase in bias current. Moreover, the arrangement does not make it possible to set the circuit into its high impedance condition during "powering on" or during tristate-operation, such as required.

In the modified operational amplifier of the present invention, as shown in FIG. 4, resistor $R_{pol}$ is removed and replaced by a controllable steady current source. By this removal, biasing of the circuit is no longer dependent on voltage variation caused by possible overvoltages. With the connection to V− removed, the collector of transistor $T_{pol}$ becomes directly connected to a drive circuit at block 12. An example of such a drive circuit is shown in the IBM TDB Bulletin, Vol. 21, No. 11, April 1979, pages 4559 and 4560 in an article entitled "Logic Interface Module" by F. Delaporte and J. P. Pantani. Thus, the current for biasing various stages of the circuit (shown by blocks 1-6 in FIG. 3) is constant and independent of the overvoltages; in addition, it may be cut off when required.

ADJUSTMENT OF THE SLEW RATE

As has been mentioned hereinabove, in conventional interface circuits the slew rate of a signal is controlled by an external capacitor. This has many drawbacks. For example, as is known, the charging and discharging of the capacitor requires a high current and causes high thermal dissipation. It is also known that as a consequence of variations in the capacitor parameters occasioned during its manufacturing process, the slew rate of a signal is poorly defined. As can be seen, the latter leads to very large variations in the overall switching time. For example, the time for a signal to go from −3 V to +3 V may be anywhere between 0.2 $\mu$s and 2 $\mu$s in prior art circuits loaded with, for example, 2500 picofarads. The length of the cable employed with interface circuits further adds to the uncertainty of this parameter.

It has also been mentioned that conventional operational amplifiers include a capacitor C to correct frequency response. However, such a capacitor arrangement in an operational amplifier has the adverse effect of limiting voltage slew rate of the circuit. In accordance with the present invention, this adverse effect has been turned into advantage. When such capacitor is not arranged in a low impedance output circuit in typical fashion but is rather located in a high impedance internal circuit, and with the Miller effect employed therewith, its nominal value is low. Such capacitor, therefore, may easily be integrated; its value is fixed and adapted to the involved circuits and to the fixed requirements of the particular application thereby ensuring a well-defined slew rate which is totally independent of the output load. The function of such capacitor, therefore, is distinct from the part it plays in an operational amplifier and, accordingly, is so designated as such by 2' in FIG. 3.

While the invention has been particularly shown and described with reference to the preferred embodiment thereof, it will be understood by those skilled in the art that various changes in form and detail may be made therein without departing from the spirit and scope of the invention.

We claim:

1. An interface circuit utilizing the stages of an operational amplifier circuit with said stages including an input differential converter stage having two input terminals E− and E+ and an output terminal coupled to a frequency compensation stage, said operational amplifier further including a voltage amplifier stage coupled to said frequency compensation stage and to positive and negative voltage follower stages with latter stages coupled via current limiting means to output terminal means, the improvement comprising;

reference voltage means coupled to one of said two input terminals E− and E+;

protection circuit means including first unilateral conducting means series connected with the positive terminal of said supply voltage and arranged to protect said operational amplifier circuit stages from positive and negative overvoltages in excess of the supply voltage occurring at said output terminal means and second unilateral conducting means coupled between said output terminal means and said first unilateral conducting means so as to protect said positive voltage follower stage and said current limiting means from positive overvoltages; and constant current bias circuit means coupled to bias said operational amplifier circuit stages at a constant bias voltage independent of overvoltages in said supply voltage.

2. The interface circuit as set forth in claim 1 wherein said first unilateral conducting means comprises first diode means.

3. The interface circuit as set forth in claim 2 wherein said first diode means comprises a lateral PNP transistor the emitter of which is the anode of said first diode means and the base and collector coupled together of which is the cathode of said first diode means.

4. The interface circuit as set forth in claim 3 wherein said reference voltage means is coupled to the E+ input terminal of said two input terminals E− and E+.

5. The interface circuit as set forth in claim 1 wherein said protection circuit means further includes anti-breakdown current mirror circuit means for protecting said negative voltage follower stage.

6. The interface circuit as set forth in claim 5 wherein said negative voltage follower stage includes output transistor means and said anti-breakdown current mirror circuit means includes simulating transistor means arranged so that its emitter to collector voltage is substantially the same as the emitter to collector voltage of said output transistor means such that said simulating transistor means acts to simulate the leakage current of said output transistor means and allow said leakage current to be sunk via sinking means to the negative terminal of said supply voltage thereby avoiding its amplification by said output transistor means.

7. The interface circuit as set forth in claim 6 wherein said sinking means comprises transistor means.

8. The interface circuit as set forth in claim 6 wherein said protection circuit means further includes third unilateral conducting means series connected with the negative terminal of said supply voltage.

9. The interface circuit as set forth in claim 8 wherein said third unilateral conducting means comprises second diode means.

10. The interface circuit as set forth in claim 9 wherein said second diode means comprises NPN transistor means the collector of which is the cathode of said second diode means and the base and emitter coupled together of which is the anode of said second diode means.

11. The interface circuit as set forth in claim 10 further including drive circuit means for selectively stopping the transmission of data through said interface circuit by placing said interface circuit into a high impedance condition.

12. The interface circuit as set forth in claim 9 or 10 integrated in chip form in planar technology and characterized in that said second diode means is mounted around the periphery of said chip and is protected by a screen of epitaxial pockets in such a way as to trap injected carriers.

* * * * *